United States Patent
Rubin et al.

(10) Patent No.: US 10,607,938 B1
(45) Date of Patent: Mar. 31, 2020

(54) POWER DISTRIBUTION NETWORKS FOR MONOLITHIC THREE-DIMENSIONAL SEMICONDUCTOR INTEGRATED CIRCUIT DEVICES

(71) Applicant: International Business Machines Corporation, Armonk, NY (US)

(72) Inventors: Joshua M. Rubin, Albany, NY (US); Terence B. Hook, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/172,048

(22) Filed: Oct. 26, 2018

(51) Int. Cl.
| | |
|---|---|
| *H01L 23/528* | (2006.01) |
| *H01L 23/522* | (2006.01) |
| *H01L 27/06* | (2006.01) |
| *H01L 21/822* | (2006.01) |
| *H01L 21/8234* | (2006.01) |
| *H01L 21/768* | (2006.01) |
| *H01L 21/762* | (2006.01) |
| *H01L 27/088* | (2006.01) |
| *H01L 21/321* | (2006.01) |

(52) U.S. Cl.
CPC .... *H01L 23/5286* (2013.01); *H01L 21/76802* (2013.01); *H01L 21/76877* (2013.01); *H01L 21/76895* (2013.01); *H01L 21/8221* (2013.01); *H01L 21/823475* (2013.01); *H01L 23/5226* (2013.01); *H01L 27/0688* (2013.01); *H01L 21/3212* (2013.01); *H01L 21/7684* (2013.01); *H01L 21/76254* (2013.01); *H01L 27/0886* (2013.01)

(58) Field of Classification Search
CPC combination set(s) only.
See application file for complete search history.

(56) References Cited

U.S. PATENT DOCUMENTS

| | | | |
|---|---|---|---|
| 5,655,290 A | 8/1997 | Moresco et al. | |
| 6,495,454 B2 | 12/2002 | Livengood et al. | |
| 8,547,769 B2 | 10/2013 | Saraswat et al. | |
| 9,018,040 B2 | 4/2015 | Lamorey et al. | |
| 9,252,101 B2 | 2/2016 | Lamorey et al. | |
| 9,941,275 B2 | 4/2018 | Or-Bach et al. | |
| 2002/0020862 A1 | 2/2002 | Livengood et al. | |
| 2004/0262635 A1* | 12/2004 | Lee | B82Y 10/00 257/199 |
| 2012/0292777 A1 | 11/2012 | Lotz | |
| 2015/0333056 A1* | 11/2015 | Du | H01L 23/528 257/773 |

OTHER PUBLICATIONS

List of IBM Patents or Patent Applications Treated as Related.
U.S. Appl. No. 16/166,996 filed in the name of Joshua M. Rubin et al. on Oct. 22, 2018 and entitled "Interlayer Via Contacts For Monolithic Three-Dimensional Semiconductor Integrated Circuit Devices."

* cited by examiner

*Primary Examiner* — Thomas L Dickey
(74) *Attorney, Agent, or Firm* — Vazken Alexanian; Ryan, Mason & Lewis, LLP

(57) ABSTRACT

Devices and methods are provided for fabricating monolithic three-dimensional semiconductor integrated circuit devices which include power distribution networks that are implemented with power distribution planes disposed below a stack of device tiers, in between device tiers, and/or above the device tiers to distribute positive and negative power supply voltage to field-effect transistor devices of the device tiers.

10 Claims, 11 Drawing Sheets

POWER DISTRIBUTION NETWORKS FOR MONOLITHIC THREE-DIMENSIONAL SEMICONDUCTOR INTEGRATED CIRCUIT DEVICES

TECHNICAL FIELD

This disclosure generally relates to monolithic three-dimensional (3D) semiconductor integrated circuit (IC) devices and, in particular, to structures and methods for fabricating power distribution networks for monolithic 3D semiconductor IC devices.

BACKGROUND

In semiconductor device manufacturing, 3D monolithic designs may include stacked layers of devices (e.g., field effect transistor (FET) devices) that are sequentially processed to reduce a device footprint. For example, a FET-over-FET integration scheme is one form of 3D monolithic integration in which p-type and n-type FET devices are separately formed on different device layers of a 3D monolithic semiconductor IC device. The separation of p-type and n-type FET devices provides certain advantages such as the ability to use more optimal or compatible semiconductor materials (e.g., germanium, silicon-germanium, silicon, group III-V compound semiconductor material, etc.) on different layers to enhance or otherwise optimize device performance.

Monolithic 3D semiconductor IC devices are fabricated using one of various conventional methods. For example, one conventional process involves fabricating a lower device tier with FET devices, and then bonding a semiconductor substrate (e.g., pristine silicon layer or silicon-on-insulator (SOI) substrate) to the lower device tier, followed by upper layer device processing to fabricate FET devices on the semiconductor substrate and connections to the lower device tier. Power delivery distribution networks for conventional 3D monolithic designs typically have parallel power busses (e.g., VDD and ground) that are formed as part of a metallization level (e.g., M2) of a back-end-of-line (BEOL) interconnect network. Vertical interconnects are formed to route ground and VDD connections from the upper power busses in the BEOL interconnect network to the underlying device tiers (or lower and upper device tiers). In addition, in each tier, a network of parallel lateral connections (e.g., power straps) are formed as part of, e.g., middle-of-the-line (MOL) metallization to route VDD and ground connections to the FET devices.

Such conventional power distribution network solutions for 3D monolithic IC designs are problematic for various reasons. For example, conventional power distribution networks typically occupy a substantial amount of area in each device layout cell, which limits integration density. In addition, the network of lateral connections, which are formed in the device layout cells in the upper and lower device tiers to laterally route the vertical power (e.g., VDD) and ground connections which are routed down from the BEOL layer, have relatively high resistance, resulting in higher power dissipation.

SUMMARY

Embodiments of the invention include monolithic 3D semiconductor IC devices comprising power distribution networks which are implemented with power distribution planes disposed below a stack of device tiers, in between device tiers, and/or above the device tiers to distribute positive and negative power supply voltage to field-effect transistor devices of the device tiers.

For example, one embodiment includes a device which comprises: a backside layer comprising a first power distribution plane; a first device tier disposed over the backside layer, wherein the first device tier comprises an integrated circuit comprising field-effect transistor devices; at least one interlayer via which vertically connects a source/drain region of at least one field-effect transistor device of the first device tier to the first power distribution plane; a second device tier disposed over the first device tier, wherein the second device tier comprises an integrated circuit comprising field-effect transistor devices; a back-end-of-line layer disposed over the second device tier, and an interconnect structure which extends from the back-end-of-line layer through the second device tier and the first device tier and which contacts the first power distribution plane to connect at least one of positive power supply voltage and negative power supply voltage to the first power distribution plane.

Another embodiment includes a device which comprises: a first device tier, wherein the first device tier comprises an integrated circuit comprising field-effect transistor devices; a second device tier disposed over the first device tier, wherein the second device tier comprises an integrated circuit comprising field-effect transistor devices; an inter-tier power distribution plane disposed between the first and second device tiers; at least one interlayer via which vertically connects a source/drain region of at least one field-effect transistor device of the second device tier to the inter-tier power distribution plane; a back-end-of-line layer disposed over the second device tier; a first vertical interconnect structure which extends from the back-end-of-line layer through the second device tier in contact with the inter-tier power distribution plane to connect at least one of positive power supply voltage and negative power supply voltage to the inter-tier power distribution plane.

Another embodiment includes a method for fabricating a semiconductor device, which comprises: forming a backside layer comprising a first power distribution plane; forming a first device tier over the backside layer, wherein the first device tier comprises an integrated circuit comprising field-effect transistor devices; forming at least one interlayer via which vertically connects a source/drain region of at least one field-effect transistor device of the first device tier to the first power distribution plane; forming a second device tier over the first device tier, wherein the second device tier comprises an integrated circuit comprising field-effect transistor devices; forming a back-end-of-line layer over second device tier; and forming a second power distribution plane which comprises a metallic plate and a plurality of contact pads which are isolated from the metallic plate by insulating spacers surrounding the contact pads, wherein the second power distribution plane is one of disposed (i) within the back-end-of-line layer and (ii) between the first and second device tiers.

In one embodiment, the second power distribution plane is formed by a method which comprises: forming a pattern of sacrificial mandrels, wherein the sacrificial mandrels define the contact pads of the second power distribution plane; forming insulating spacers surrounding the sacrificial mandrels; performing an etch process to etch the sacrificial mandrels selective to the insulating spacers and remove the sacrificial mandrels; and depositing a layer of metallic material to fill regions within the insulating spacers to form the contact pads and to fill the region outside the insulating spaces to form the metallic plate.

Other embodiments will be described in the following detailed description of embodiments, which is to be read in conjunction with the accompanying figures.

BRIEF DESCRIPTION OF THE DRAWINGS

FIGS. 6-9 schematically illustrate a method for fabricating a monolithic 3D semiconductor integrated circuit device comprising a power distribution network having a backside power distribution plane, according to an embodiment of the invention, wherein:

FIG. 6 is a schematic cross-sectional side view of a semiconductor device at an intermediate stage of fabrication in which a wafer bonding process is performed to bond a first semiconductor-on-insulator substrate to a backside layer comprising a backside power distribution plane;

FIG. 7 is a schematic cross-sectional side view of the semiconductor device structure of FIG. 6 after fabricating a first device tier on the backside layer using the first semiconductor-on-insulator substrate;

FIG. 8 is a schematic cross-sectional side view of the semiconductor device structure at an intermediate stage of fabrication in which a wafer bonding process is performed to bond a second semiconductor-on-insulator substrate to the first device tier of the intermediate device structure of FIG. 7 using a bonding layer formed on a front side of the second semiconductor-on-insulator substrate; and FIG. 9 is a schematic cross-sectional side view of the semiconductor device structure of FIG. 8 after fabricating a second device tier on the first device tier using the second semiconductor-on-insulator substrate.

FIGS. 11A through 16B schematically illustrate a method for fabricating the monolithic 3D semiconductor integrated circuit device of FIG. 10 with the inter-tier power distribution plane, according to an embodiment of the invention, wherein:

FIG. 11A is a schematic cross-sectional side view of the semiconductor integrated circuit device at an intermediate stage of fabrication in which a pattern of sacrificial mandrels is formed on the first device tier;

FIG. 12 is a schematic cross-sectional side view of the semiconductor device structure of FIG. 11A after forming a conformal insulating layer over the surface of the semiconductor device structure to conformally cover the sacrificial mandrels with insulating material;

FIG. 14 is a schematic cross-sectional side view of the semiconductor device structure of FIG. 13A after removing the sacrificial mandrels;

FIG. 15 is a schematic cross-sectional side view of the semiconductor device structure of FIG. 14 after depositing a layer of metallic material to encapsulate the insulating spacers in metallic material;

FIG. 16B is a top plan view of the semiconductor device structure of FIG. 16A.

DETAILED DESCRIPTION

Figure 1:
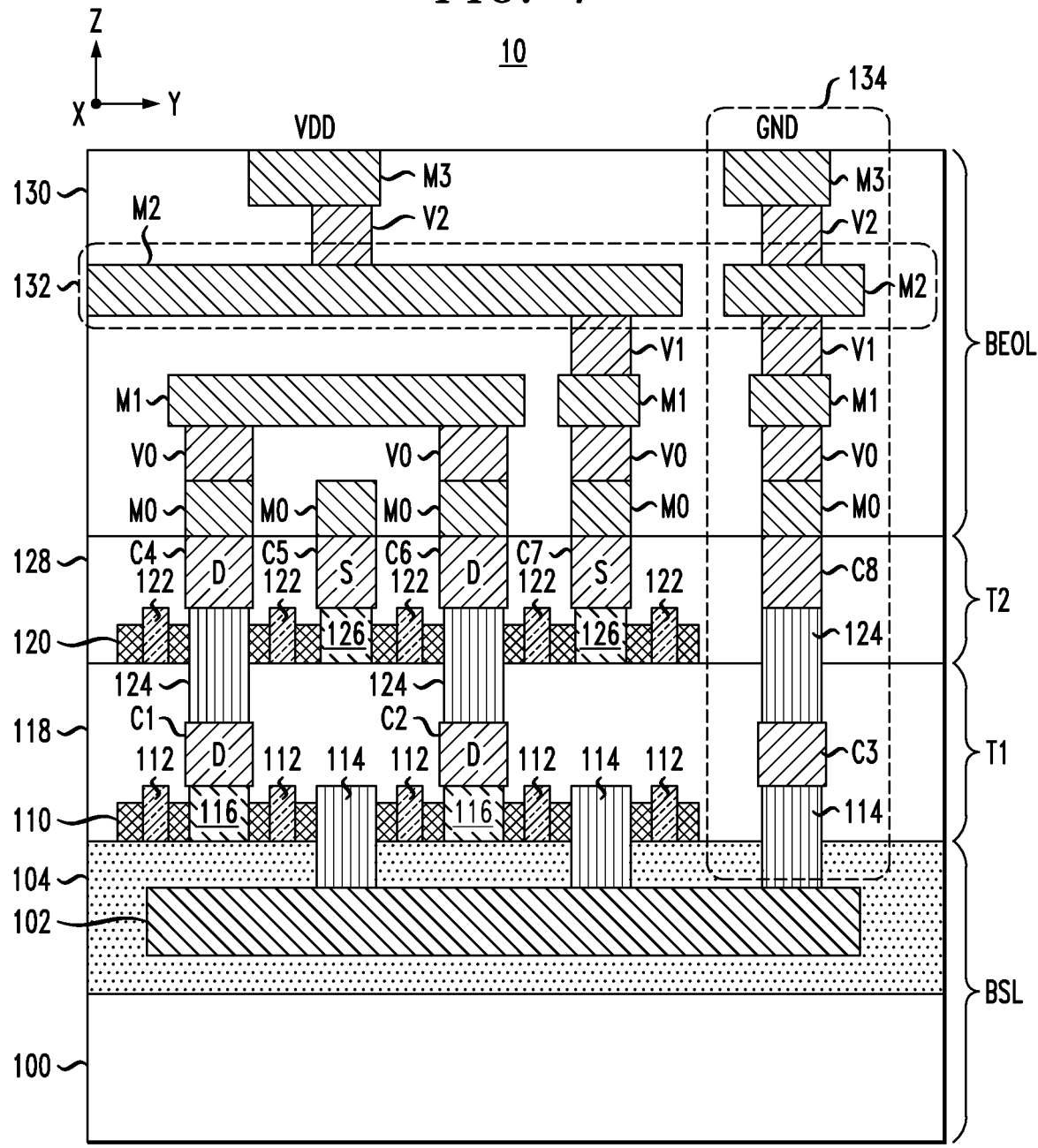
FIG. 1 is a schematic cross-sectional view of a monolithic 3D semiconductor integrated circuit device comprising a power distribution network having a backside power distribution plane, according to an embodiment of the invention.

Embodiments will now be described in further detail with regard to methods for fabricating power distribution networks for monolithic 3D semiconductor IC devices. As explained in further detail below, power distribution networks for monolithic 3D semiconductor IC devices are implemented using power distribution planes disposed below a stack of device tiers (e.g., backside power distribution planes) and/or in between device tiers (e.g., inter-tier power distribution planes) to distribute either negative power supply voltage (e.g., ground (GND) or VSS) or positive power supply voltage (e.g., VDD) to FET devices within the device tiers. For example, exemplary embodiments of monolithic 3D semiconductor IC devices as discussed herein have power distribution networks with backside power distribution planes disposed below a stack of device tiers to distribute negative power supply voltage (e.g., GND or VSS), and back-end-of-line (BEOL) power distribution planes that are formed as part of a BEOL layer above the stack of device tiers to distribute positive power supply voltage (e.g., VDD). In other embodiments, backside power distribution planes are utilized to distribute positive power supply voltage, and BEOL power distribution planes are utilized to distribute negative power supply voltage. In other embodiments, inter-tier power distribution networks are disposed between device tiers to distribute negative or positive power supply voltage to FET devices within the device tiers. In other embodiments, power distribution networks are implemented using multiple inter-tier power distribution planes disposed between device tiers to provide both positive and negative power supply voltage planes to the device tiers.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor device structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount. To provide spatial context, XYZ Cartesian coordinates are shown in the drawings of semiconductor device structures. It is to be understood that the term "vertical" as used herein denotes a Z-direction of the Cartesian coordinates shown in the drawings, and that the terms "horizontal" or "lateral" as used herein denote an X-direction and/or a Y-direction of the Cartesian coordinates shown in the drawings, which is perpendicular to the Z-direction.

FIG. 1 is a schematic cross-sectional view of a monolithic 3D semiconductor integrated circuit device 10 comprising a power distribution network having a backside power distribution plane, according to an embodiment of the invention. As shown in FIG. 1, the semiconductor device 10 comprises a backside layer BSL, a first (lower) device tier T1, a second (upper) device tier T2, and a back-end-of-line layer (or BEOL layer). The backside layer BSL comprises a wafer substrate 100, a backside power distribution plane 102, and a layer of insulating material 104 encapsulating the backside power distribution plane 102. The first device tier T1 comprises a plurality of fin-type FET devices (or FinFET devices) comprising a vertical semiconductor fin 110 and a plurality of gate structures 112 which overlap the vertical semiconductor fin 110. As is readily understood by one of ordinary skill in the art, the portions of the vertical semiconductor fin 110 which are overlapped by the gate structures 112 define channel regions of the FinFET devices, and exposed portions of the vertical semiconductor fin 110 which extend from sidewalls of the gate structures 112 provide source/drain regions for the FinFET devices. The source/drain regions of the FinFET devices may comprise epitaxial semiconductor layers that are grown on the exposed surfaces of the vertical semiconductor fin 110 using known methods. It is to be understood that the term "source/drain region" as used herein means that a given source/drain region can be either a source (S) region or a drain (D) region for the given FinFET device, depending on the application.

The first device tier T1 further comprises a plurality of interlayer via contacts 114, a plurality of source/drain contacts 116 (e.g., shared silicide trench contacts), vertical contacts C1, C2 and C3 (e.g., middle-of-the-line (MOL) contacts), and an insulating layer 118. As schematically shown in FIG. 1, the interlayer via contacts 114 are fabricated to provide direct vertical connections between the backside power distribution plane 102 and source/drain regions of the FinFET devices and vertical contacts (e.g., C3) of the first device tier T1. The insulating layer 118 comprises a plurality of insulating layers including bonding layers which bond the first and second device tiers T1 and T2. For example, the insulating layer 118 is formed by depositing and patterning multiple layers of insulating material at different stages of fabrication of the first device tier T1. For example, the insulating layer 118 comprises a pre-metal deposition (PMD) insulating layer that is deposited to encapsulate the FET devices, an interlayer dielectric (ILD) layer that is deposited over the PMD layer and patterned to form contact openings (and trenches) which are filled with metallic material to form the MOL contacts C1, C2, and C3 (and metal lines). In addition, the insulating layer 118 includes one or more bonding layers formed on the upper ILD layer of the first device tier T1, which are used to bond the device tiers T1 and T2 together.

The MOL contacts C1, C2, and C3 (and horizontal interconnect wiring) may comprise metallic fill material including, but not limited to, tungsten, cobalt, ruthenium, copper, or combinations thereof, as well as thin liner layers (e.g., titanium nitride (TiN) and/or tantalum nitride (TaN) barrier layer and/or seed layer) which are formed prior to depositing the metallic fill material. In one embodiment, the source/drain contacts 116 may comprises a shared silicide trench contact, as is understood by one of ordinary skill in the art. In this example embodiment, the source/drain contact 116 (as a shared silicide trench contact) would comprise a silicide layer disposed on the source/drain region of the vertical semiconductor fin 110 and a metallic fill material that forms the vertical contact 116. The silicide layer is formed by depositing a thin layer of a transition metal such as nickel, cobalt, titanium, platinum, tungsten, tantalum, an alloy such as titanium-aluminum or titanium-nitride, etc., or any other suitable metallic material, on an exposed surface of the source/drain region of the vertical semiconductor fin 110 (or on an additional thin epitaxial semiconductor layer grown on the source/drain region of the vertical semiconductor fin 110). A thermal anneal process is performed at an appropriate temperature to induce a reaction between the epitaxial material and the transition metal layer to form a metal-semiconductor alloy layer (or silicide layer).

The second device tier T2 comprises a plurality of FinFET devices comprising a vertical semiconductor fin 120 and a plurality of gate structures 122 which overlap the vertical semiconductor fin 120. The portions of the vertical semiconductor fin 120 which are overlapped by the gate structures 122 define channel regions of the FinFET devices, and exposed portions of the vertical semiconductor fin 120 which extend from sidewalls of the gate structures 122 provide source/drain regions for the FinFET devices. The source/drain regions of the FinFET devices may comprise epitaxial semiconductor layers that are grown on the exposed surfaces of the vertical semiconductor fin 120 using known methods.

The second device tier T2 further comprises a plurality of interlayer via contacts 124, a plurality of source/drain contacts 126 (e.g., shared silicide trench contacts), vertical contacts C4, C5, C6, C7 and C8 (e.g., MOL contacts), and an insulating layer 128 (which comprises a plurality of insulating layers). As schematically shown in FIG. 1, the interlayer via contacts 124 provide vertical connections between the source/drain regions of the FinFET devices of the second device tier T2 and vertical source/drain contacts (e.g., C1 and C2) of the first device tier T1, and between vertical contacts (e.g., C8) of the second device tier T2 and vertical contacts (e.g., C3) of the first device tier T1.

The BEOL layer comprises an interconnect structure, which comprises multiple levels of metal lines and inter-level metal vias, to connect the integrated circuit components and devices (e.g., FinFET device) that are fabricated as part of the first and second device tiers T1 and T2, and to provide a power distribution network for routing positive power supply voltage (e.g., VDD) and negative power supply voltage (e.g., VSS or ground) to the active devices. The BEOL layer comprises a first level of metallization comprising a plurality of metallic structures M0 and vertical vias V0, a second level of metallization comprising a plurality of metallic structures M1 and vertical vias V1, a third level of metallization comprising a plurality of metallic structures M2 and vertical vias V2, and a fourth level of metallization comprising a plurality of metallic structures M3. As is understood by one of ordinary skill in the art, the metallic structures M0, M1, M2 and M3 may comprise horizontal wiring and contact pads to form part of the BEOL interconnect structures. The plurality of vertical vias V0, V1, and V2 serve to provide vertical connections between the wiring and contacts of the various metallization levels of the BEOL layer. The metal lines and inter-level metal vias of the BEOL layer are encapsulated in insulating material 130, wherein the insulating material is formed of multiple ILD layers, as is understood by one of ordinary skill in the art.

It is to be understood that while the exemplary embodiments illustrated throughout the drawings show device tiers T1 and T2 with integrated circuitry comprising FinFET devices, the device tiers T1 and T2 can additionally or alternately include other types of FET devices such as planar FET devices, nanosheet FET devices, nanowire FET devices, and other types of non-planar FET device structures. In addition, the integrated circuitry of the first and second device tiers T1 and T2 can include other types of active or passive devices which are needed to form a functional integrated circuit for the given application.

It is to be understood that the interlayer via contacts 114 of the first device tier T1 can be fabricated with different dimensions and configurations, and in multiple steps, depending on the circuit layout and process flow. Similarly, the interlayer via contacts 124 of the second device tier T2 can be fabricated with different dimensions and configurations, and in multiple steps, depending on the circuit layout and process flow. For example, in one embodiment, the interlayer via contacts 114 and 124 which are formed within the source/drain regions of the FET devices in the active device areas of the device tiers T1 and T2 can be formed using interlayer via contact fabrication methods as disclosed in U.S. patent application Ser. No. 16/166,996, entitled: "Interlayer Via Contacts For Monolithic Three-Dimensional Semiconductor Integrated Circuit Devices," filed on Oct. 22, 2018, which is fully incorporated by reference herein.

In particular, using techniques as disclosed in U.S. patent application Ser. No. 16/166,996, an interlayer via contact 114 within source/drain regions of adjacent FET devices of the first device tier T1 can be formed by a process which comprises: (i) etching an insulating layer (e.g., PMD layer) to form an interlayer via contact opening between adjacent first and second gate structures of first and second FET devices, wherein a width of the interlayer via contact opening is defined by a spacing between adjacent sidewalls of the first and second gate structures; (ii) forming epitaxial source/drain layers within the interlayer via contact opening for the first and second FET devices, and (iii) forming a metallic interlayer via contact within the interlayer via contact opening in contact with a portion of the backside power distribution plane 102 exposed at a bottom of the interlayer via contact opening. Similarly, an interlayer via contact 124 within source/drain regions of adjacent FET devices of the second device tier T2 can be formed by a process which comprises: (i) etching an insulating layer (e.g., PMD layer) to form an interlayer via contact opening between adjacent first and second gate structures of first and second FET devices, wherein a width of the interlayer via contact opening is defined by a spacing between adjacent sidewalls of the first and second gate structures; (ii) forming epitaxial source/drain layers within the interlayer via contact opening for the first and second FET devices, and (iii) forming a metallic interlayer via contact within the interlayer via contact opening in contact with a portion of an underlying MOL contact/wire (e.g., C1 or C2) which is exposed at the bottom of the interlayer via contact opening.

FIG. 1 schematically illustrates an exemplary embodiment of a FET-over-FET integration scheme of the monolithic 3D semiconductor IC device 10 in which the first device tier T1 comprises N-type FinFET devices and the second device tier T2 comprises P-type FinFET devices. In this embodiment, the backside power distribution plane 102 is configured to distribute negative power supply voltage (e.g., GND or VSS) to source regions of the N-type FinFET devices of the first device tier T1 via the interlayer via contacts 114. In addition, the BEOL layer comprises a power distribution plane 132 to distribute positive power supply voltage (e.g., VDD) to the FinFET devices of the first and second device tiers T1 and T2. As further shown in FIG. 1, an interconnect structure 134 is formed to route a ground (GND) connection from the metallization M3 to the backside power distribution plane 102. While only one interconnect structure 134 is shown for ease of illustration, the semiconductor device 10 would comprise a plurality of interconnect structures 134 periodically distributed over the given device layout to provide multiple ground connections to the backside power distribution plane 102 from the upper BEOL layer.

It is to be noted that the interlayer via contacts 114 and 124 of the device tiers T1 and T2 which form part of the interconnect structure 134 can be fabricated at a different stage (not concurrently with) of the process flow in which the interlayer via contacts 114 and 124 are fabricated in the source/drain regions of the FET devices within the active area of the circuitry to provide direct vertical connections between the source/drain regions and underlying metallization structure (e.g., the backside power distribution plane 102 and MOL metallization C1 and C2). In another embodiment, all interlayer via contacts 114 of the first device tier T1 can be concurrently fabricated (e.g., concurrent patterning and metal fill steps) and all interlayer via contacts 124 of the second device tier T2 can be concurrently fabricated (e.g., concurrent patterning and metal fill steps).

In an alternate embodiment, a FET-over-FET integration scheme of the monolithic 3D semiconductor IC device 10 can be implemented in which the first device tier T1 comprises P-type FinFET devices and the second device tier T2 comprises N-type FinFET devices. In such alternate embodiment, the backside power distribution plane 102 would be configured to distribute positive power supply voltage (e.g., VDD) to the first device tier T1 using the interlayer via contacts 114 connected to source regions of the P-type FinFET devices of the first device tier T1. In addition, the power distribution plane 132 of the BEOL layer would be configured to distribute negative power supply voltage (GND or VSS) to the FinFET devices of the first and second device tiers T1 and T2.

In another embodiment, a CMOS-over-CMOS integration scheme of the monolithic 3D semiconductor IC device 10 can be implemented in which the first device tier T1 comprises both N-type and P-type FET devices and the second device tier T2 comprises both N-type and P-type FET devices. In this embodiment, the backside power distribution plane 102 could be configured to distribute both positive and negative power supply voltage to the first device tier T1 using the interlayer via contacts 114 connected to source/drain regions of the N-type and P-type FET devices of the first device tier T1. In addition, the power distribution plane 132 of the BEOL layer could be configured to distribute both positive and negative power supply voltage to the FET devices of the second device tier T2. In this embodiment, the power distribution planes could comprise at least one metallization layer having a first metallization pattern for distributing positive power supply voltage and a second metallization pattern for distributing negative power supply voltage. In another embodiment, a power distribution plane (e.g., backside, inter-tier, or BEOL) could include multiple (stacked) metallization layers configured to distribute positive and/or negative power supply voltage the device tiers T1 and T2.

Figure 2:
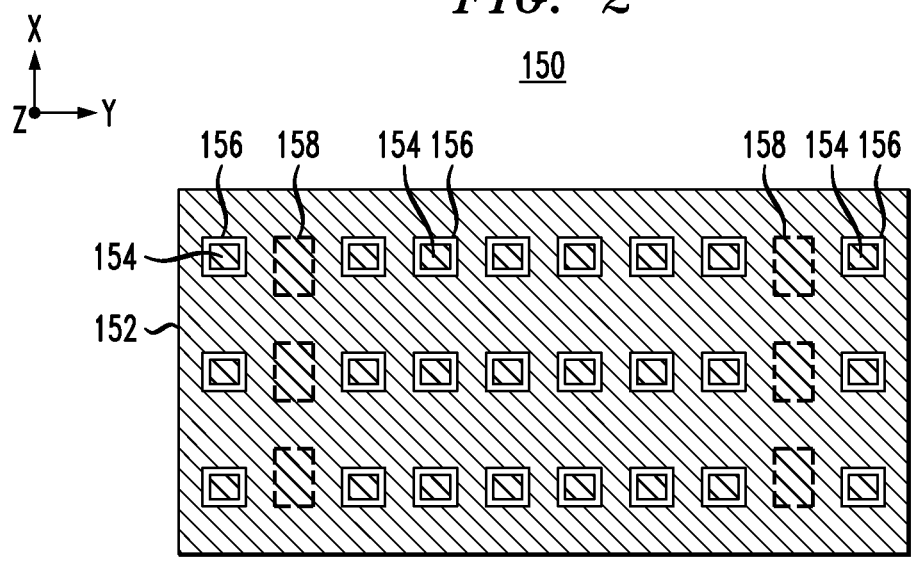
FIG. 2 schematically illustrates a power distribution plane according to an exemplary embodiment of the invention.

FIG. 2 schematically illustrates a power distribution plane 150 according to an exemplary embodiment of the invention. The power distribution plane 150 comprises a metallic plate 152, a plurality of contact pads 154, and isolation layers 156. The metallic plate 152 serves to distribute positive power supply voltage (e.g., VDD) or negative power supply voltage (e.g., GND, VSS) to devices through vertical interconnects or contacts which are periodically formed in contact with the upper and bottom surfaces of the metallic plate 152 at various contact regions 158 (shown as dashed rectangles) over the footprint of the metallic plate 152. The contact pads 154 allow for signal connections and other power connections to be routed through the power distribution plane 150 between layers that are disposed above and below the power distribution plane 150. The isolation layers 156 surround the contact pads 154 and serve to electrically isolate the contact pads 154 from the metallic plate 152.

In one exemplary embodiment, the power distribution plane 150 can be included as part of a BEOL layer to distribute positive supply voltage (e.g., VDD) from upper BEOL metallization layers to the underlying device tiers. For example, the power distribution plane 150 illustrates an exemplary embodiment of the power distribution plane 132 of FIG. 1 to distribute positive power supply voltage (e.g., VDD) to the FinFET devices of the first and second device tiers T1 and T2. In this embodiment, metallic plate 152 and contact pads 154 would comprise metallic structures of the metallization level M2. The contact pads 154 would comprise contacts that form part of the vertical interconnect structures (e.g., vertical interconnect structure 134) to route ground connections from the upper metallization level M3 down to the backside power distribution plane 102. In addition, the contact pads 154 would comprise contacts that are formed as part of other interconnect structures to route gate control signals to gate terminals of the FET devices in the first and second device tiers and to provide other I/O interconnect structures that are routed through the metallic plate 152.

In another embodiment, the power distribution plane 150 can be included as part of a BEOL layer to distribute ground voltage (e.g., ground or VSS) from upper BEOL metallization layers to the underlying device tiers. For example, the power distribution plane 150 illustrates an exemplary embodiment of the power distribution plane 132 of FIG. 1 to distribute ground voltage to the FinFET devices of the first and second device tiers T1 and T2, while the backside power distribution plane 102 would be utilized to distribute positive power supply voltage (VDD) to the FinFET devices of the first and second device tiers T1 and T2. In this embodiment, the contact pads 154 would comprise contacts that form part of vertical interconnect structures to route VDD connections from the upper metallization level M3 down to the backside power distribution plane 102, as well as contacts that are formed as part of other interconnect structures to route gate control signals to gate terminals of the FET devices in the first and second device tiers and to provide other I/O interconnect structures that are routed through the metallic plate 152.

Figure 3:
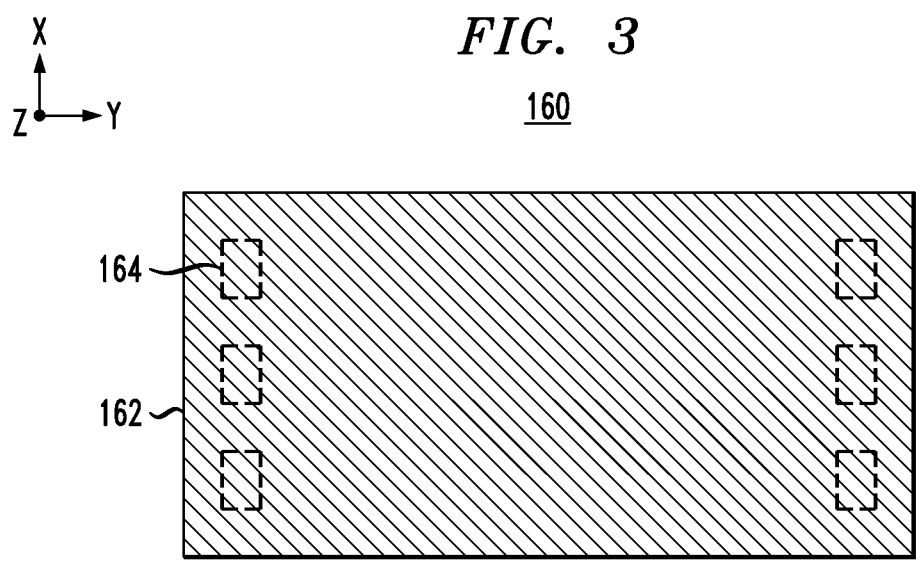
FIG. 3 schematically illustrates a power distribution plane according to another exemplary embodiment of the invention.

FIG. 3 schematically illustrates a power distribution plane 160 according to another exemplary embodiment of the invention. In particular, FIG. 3 schematically illustrates an exemplary embodiment of a backside power distribution plane (e.g., backside power distribution plane 102, FIG. 1) which can be implemented to distribute positive power supply voltage (e.g., VDD) or negative power supply voltage (e.g., ground or VSS) to device tiers disposed above the backside power distribution plane. The power distribution plane 160 comprises a metallic plate 162, which is embedded in insulating material. FIG. 3 further illustrates a plurality of contact regions 164 (shown as dashed rectangles) in which interlayer via contacts are periodically formed from the first device tier in contact with the backside power distribution plane 160 to provide VDD or ground connections which are routed from the BEOL layers through the device tiers to the backside power distribution plane 160.

Figure 4:
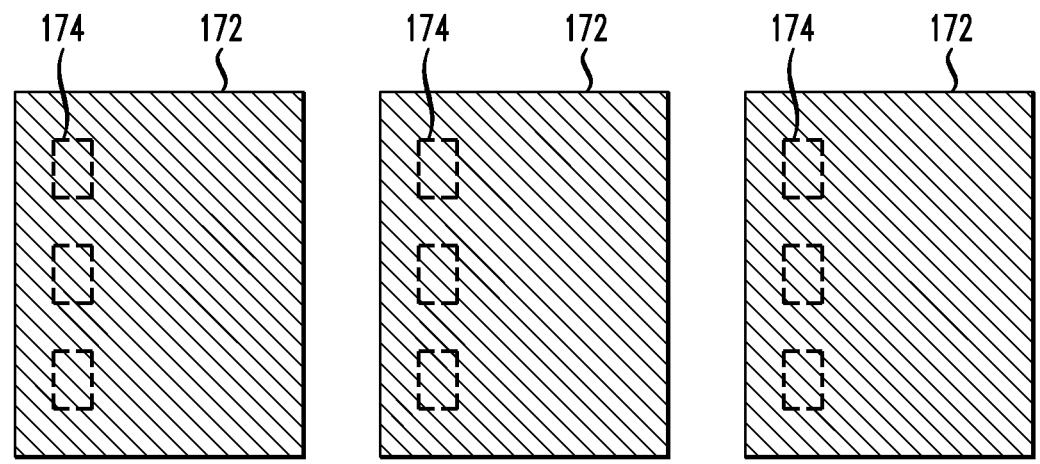
FIG. 4 schematically illustrates a power distribution plane according to another exemplary embodiment of the invention.

FIG. 4 schematically illustrates a power distribution plane 170 according to another exemplary embodiment of the invention. In particular, FIG. 4 schematically illustrates an exemplary embodiment of a backside power distribution plane (e.g., backside power distribution plane 102, FIG. 1) which can be implemented to distribute positive power supply voltage (e.g., VDD) or negative power supply voltage (e.g., ground or VSS) to device tiers disposed above the backside power distribution plane. The power distribution plane 170 comprises a plurality of metallic plates 172, which are embedded in insulating material. FIG. 4 further illustrates a plurality of contact regions 174 (shown as dashed rectangles) in which interlayer via contacts are periodically formed to extend from the first device tier in contact with the backside power distribution plane 170 to provide VDD or ground connections which are routed from the BEOL layers through the device tiers to the backside power distribution plane 170.

In comparison to the power distribution plane 160 of FIG. 3 which comprises a single metallic plate 162, the power distribution plane 170 of FIG. 4 comprises a plurality of metallic plates 172 which span the device cells, but which provide a reduced area of metallization as compared to the single metallic plate 162. The configuration of FIG. 4 serves to reduce the parasitic capacitance between the backside power distribution plane 170 and elements of the first device tier. In addition, the smaller area metallic plates 172 serves to minimize dishing effects that can occur when using a chemical mechanical polishing (CMP) process to form the backside power distribution plane 170.

Figure 5:
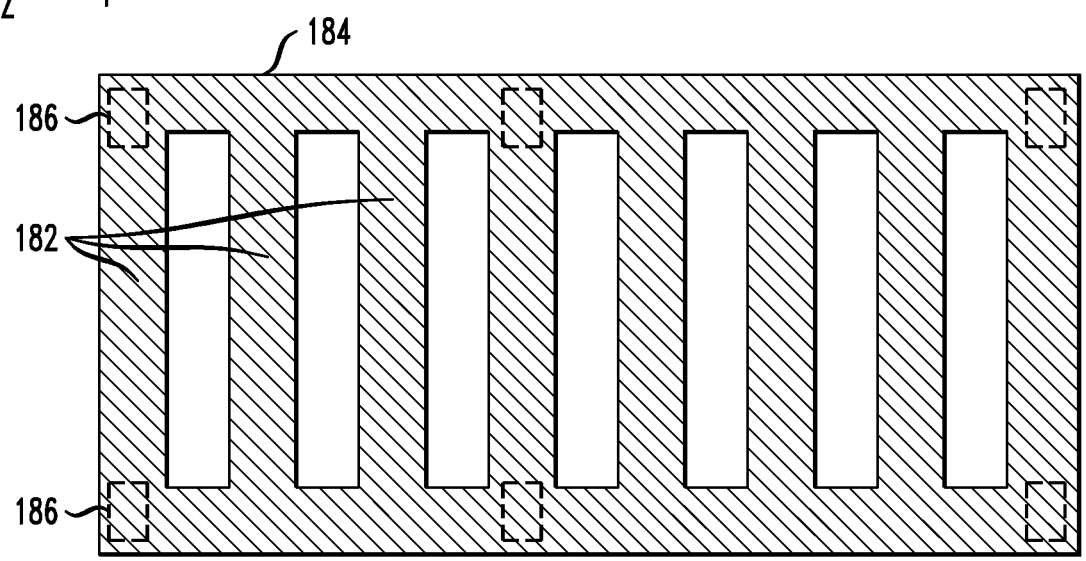
FIG. 5 schematically illustrates a power distribution plane according to another exemplary embodiment of the invention.

FIG. 5 schematically illustrates a power distribution plane 180 according to another exemplary embodiment of the invention. In particular, FIG. 5 schematically illustrates an exemplary embodiment of a backside power distribution plane (e.g., backside power distribution plane 102, FIG. 1) which can be implemented to distribute positive power supply voltage (e.g., VDD) or negative power supply voltage (e.g., ground or VSS) to device tiers disposed above the backside power distribution plane 180. The power distribution plane 180 comprises a plurality of metallic wires 182 which are disposed in parallel, and elongated wires 184 which are disposed and connected to opposing ends of the metallic wires 182, thereby forming a mesh-type interconnect structure, which is embedded in insulating material. FIG. 5 further illustrates a plurality of contact regions 186 (shown as dashed rectangles) in which interlayer via contacts are periodically formed to extend from the first device tier in contact with the backside power distribution plane 180 to provide VDD or ground connections which are routed from the BEOL layer through the device tiers to the backside power distribution plane 180. FIG. 5 illustrates one non-limiting exemplary embodiment of a mesh-type pattern which can serve as a power distribution plane. Other types of mesh-type patterns can be utilized using one or more stacked metallization layers, as is readily contemplated by one of ordinary skill in the art.

In comparison the power distribution plane 160 of FIG. 3 which comprises a single metallic plate 162, the power distribution plane 180 of FIG. 5 provides a reduced area of metallization as compared to the single metallic plate 162. The configuration of FIG. 5 serves to reduce the parasitic capacitance between the backside power distribution plane 180 and elements of the first device tier. In addition, the smaller area of the metallic wires 182 and 184 serves to minimize dishing effects that can occur when using a chemical mechanical polishing (CMP) process to form the backside power distribution plane 180.

In another embodiment, a power distribution plane (e.g., backside, inter-tier, or BEOL) can be formed with at least one metallization layer comprising an array of parallel metal lines. In this instance, all metal lines in the array can be configured to distribute positive or negative power supply voltage. In another embodiment, the array of parallel metal lines can include a first set of metal lines to distribute positive power supply voltage and a second set of metal lines to distribute negative power supply voltage (e.g., alternating VDD and GND metal lines).

In another embodiment, a power distribution plane (e.g., backside, inter-tier, or BEOL) can be formed with at least two stacked metallization layers wherein a first metallization layer comprises an array of parallel metal lines that extend in one direction (e.g., X-direction) and wherein a second metallization layer comprises an array of parallel metal lines that extend in another direction (e.g., Y-direction) orthogonal to the metal lines of the first metallization layer. In one embodiment, the first and second metallization layers each comprise alternating VDD and GND metal lines, wherein the VDD lines of the first and second metallization layers are connected using vertical vias, and wherein the GND lines of the first and second metallization layers are connected using vertical vias. In another embodiment, all metal lines of the first and second metallization layers comprise only VDD metal lines which are connected using vertical vias, or only GND metal lines which are connected using vertical vias. The stacked metallization layers connected by vertical vias provides a lower resistance power distribution plane for distributing positive and/or negative power supply voltage.

Figure 6:
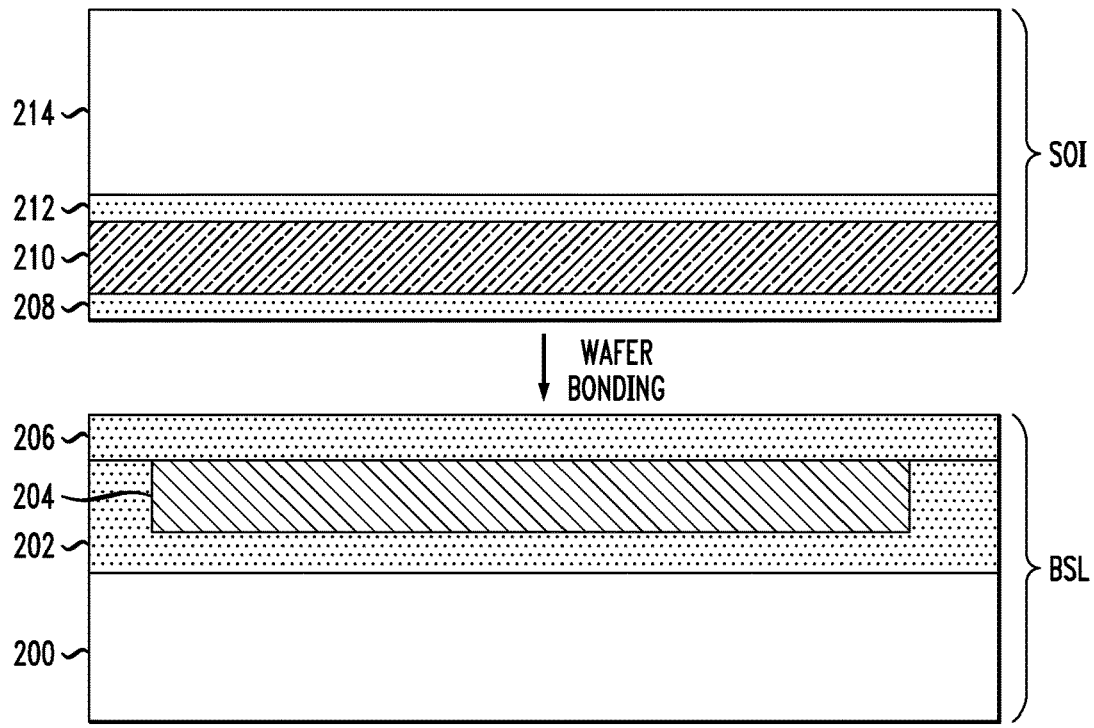

FIGS. 6-9 schematically illustrate a method for fabricating a monolithic 3D semiconductor integrated circuit device 20 comprising a power distribution network having a backside power distribution plane, according to an embodiment of the invention. To begin, FIG. 6 is a schematic cross-sectional side view of the semiconductor device 20 at an intermediate stage of fabrication in which a wafer bonding process is performed to bond a semiconductor-on-insulator (SOI) substrate to a backside layer BSL comprising a backside power distribution plane. The backside layer BSL comprises a semiconductor substrate 200 (e.g., silicon wafer), an insulating layer 202, a backside power distribution plane 204 formed in the insulating layer 202, and a bonding layer 206 (e.g., silicon oxide). The SOI substrate comprises a bonding layer 208 (e.g., silicon oxide) which is used to bond the SOI substrate to the backside layer BSL via oxide-to-oxide bonding of the bonding layers 206 and 208. The SOI substrate comprises an active semiconductor layer 210, a buried insulating layer 212, and a bulk semiconductor layer 214. In one embodiment, the active semiconductor layer 210 and the bulk semiconductor layer 214 comprise silicon layers and the buried insulating layer 212 comprises a silicon oxide layer.

The backside layer BSL can be fabricated using various methods. For example, in one embodiment, the insulating layer 202 (e.g., silicon oxide) is formed on the semiconductor substrate 200 and photolithographically patterned to form a trench pattern which comprises one or more trenches that define a pattern of the power distribution plane 204. The power distribution plane 204 is then fabricated by forming a conformal liner layer to line the sidewall and bottom surfaces of the trench(es), followed by depositing a layer of metallic material to fill the trench(es) with metallic material. The conformal liner layer comprises one or more conformal layers of materials that are commonly used to form, e.g., diffusion barrier layers and seed layers. In one embodiment, the power distribution plane 204 is formed of tungsten, although other suitable metallic materials such as copper may be used to form the power distribution plane 204.

Following the deposition of the liner and metallic layers, a CMP process is performed to remove the overburden material and planarize the surface of the intermediate structure down to the insulating layer 202. A layer of insulating material (e.g., silicon oxide) is then deposited on the planarized surface to form the bonding layer 206. The SOI substrate is then bonded to the backside layer BSL using any suitable wafer bonding method for bonding the oxide bonding layers 206 and 208.

While the backside power distribution plane 204 is generically depicted in FIG. 6 for ease of illustration, it is to be understood that the backside power distribution plane 204 can be formed to have any desired pattern which is suitable for the given application and circuit layout. For example, the backside power distribution plane 204 can have patterns that are the same or similar to those depicted in FIGS. 3, 4 and 5. In addition, FIG. 6 illustrates an exemplary embodiment in which an SOI substrate is bonded to the backside layer BSL, other methods can be utilized to bond the semiconductor wafer 210 to the backside layer BSL.

For example, in one embodiment, the semiconductor substrate 210 can be a pristine silicon wafer that is bonded to a handle wafer (e.g., layer 214) via a bonding layer (e.g., layer 212). The semiconductor substrate 210 is then bonded to the backside layer BSL by oxide-to-oxide bonding of the oxide bonding layers 206 and 208, followed by removal of the handle wafer by, e.g., grinding away a significant portion of the handle wafer, followed by a dry etch (e.g., RIE) or wet etch process to remove the remaining portion of the handle wafer and bonding layer. The semiconductor substrate 210 can then be thinned by using a backside silicon etch or grinding process. In another embodiment, a "smart cut" process can be utilized by implanting hydrogen into a surface of the semiconductor substrate 210 to a target depth, prior to bonding the semiconductor substrate 210 to the handle wafer. Then, the handle wafer is bonded to the hydrogen-implanted surface of the semiconductor substrate 210 via the bonding layer (e.g., layer 212), followed by bonding the semiconductor substrate 210 to the backside layer BSL by oxide-to-oxide bonding of the oxide bonding layers 206 and 208. Thereafter, a thermal process is performed to cleave off the hydrogen-implanted layer of the semiconductor substrate 210 and thereby release the handle wafer.

Figure 7:
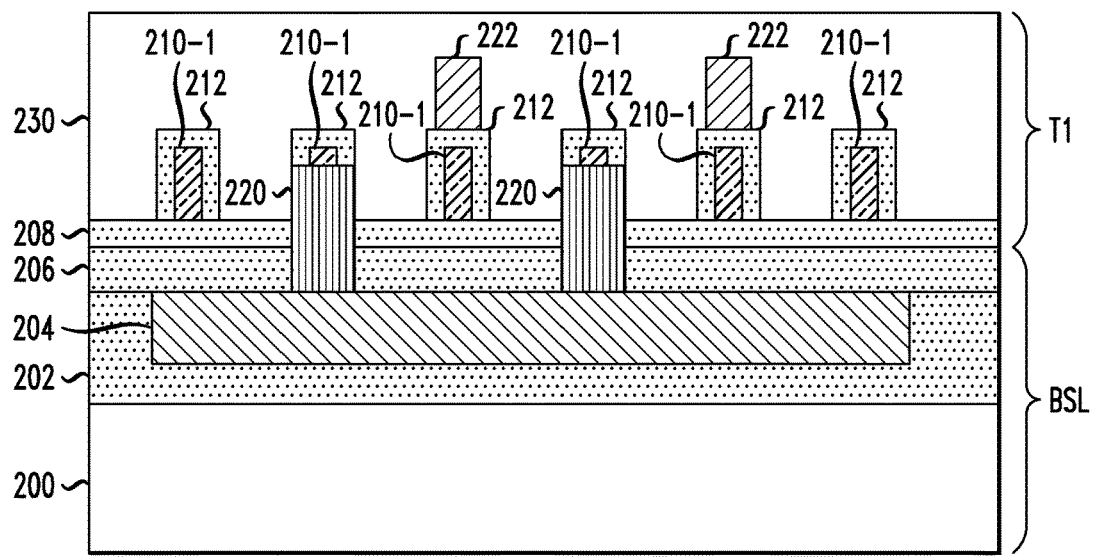

Next, FIG. 7 is a schematic cross-sectional side view of the semiconductor device structure of FIG. 6 after fabricating a first device tier T1 on the backside layer BSL, wherein the first device tier T1 comprises FinFET devices of a first dopant type (e.g. N-type FinFET devices). In particular, the first device tier T1 comprises a plurality of semiconductor fins 210-1 which are patterned from the semiconductor layer 210 (FIG. 6), gate structures 212 that are formed over portions of the vertical semiconductor fins 210-1, interlayer via contacts 220 which provide connections from source/drain regions of the FinFET devices to the backside power distribution plane, vertical contacts 222 to source/drain regions of the FinFET devices, and an insulating layer 230. In the exemplary embodiment of FIG. 7, the vertical semiconductor fins 210-1 extend in the Y-direction, and the interlayer via contacts 220 and vertical contacts 222 are formed in contact with exposed portions of the vertical semiconductor fins 210-1 which extend from sidewalls of the gate structures 212. The interlayer via contacts 220 can be formed using methods disclosed in U.S. patent application Ser. No. 16/166,996, as discussed above.

The insulating layer 230 comprises a plurality of insulating layers (e.g., ILD layers) which are sequentially deposited at different stages of fabrication of the first device tier T1. The insulating layer 230 further comprises an upper oxide bonding layer that is formed on the upper ILD layer of the insulating layer 230 to provide a bonding layer for bonding the intermediate structure of FIG. 7 to another semiconductor layer that is processed to form a second device tier.

Figure 8:
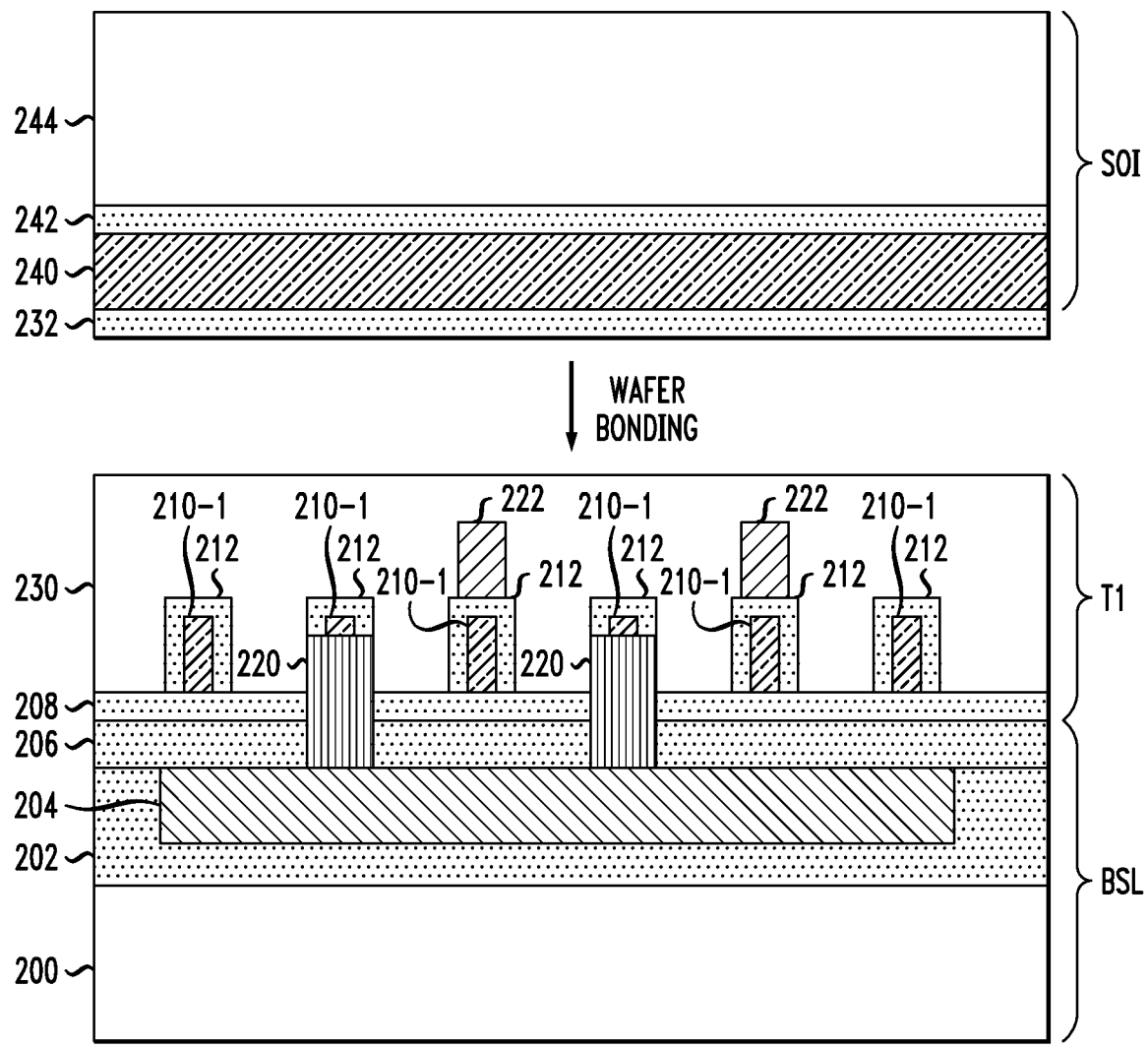

In particular, FIG. 8 is a schematic cross-sectional side view of the semiconductor device structure 20 at an intermediate stage of fabrication in which a wafer bonding process is performed to bond an SOI substrate to the first device tier T1 of the intermediate device structure of FIG. 7 using a bonding layer 232 formed on a front side of the SOI substrate. The SOI substrate comprises an active semiconductor layer 240, a buried insulating layer 242, and a bulk semiconductor layer 244. In one embodiment, the active semiconductor layer 240 and the bulk semiconductor layer 244 comprise silicon layers and the buried insulating layer 242 comprises a silicon oxide layer. Other methods as discussed above can be utilized to bond a semiconductor layer to the first device tier T1.

Figure 9:
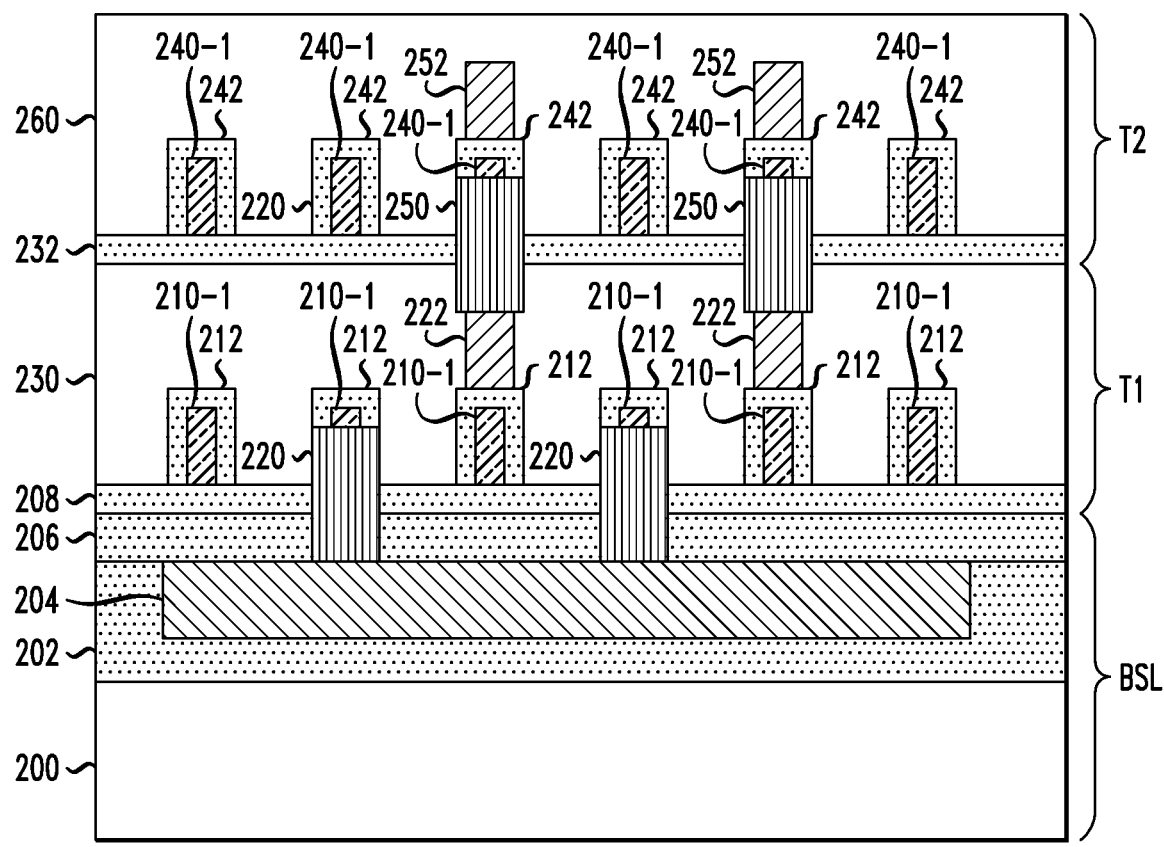

Next, FIG. 9 is a schematic cross-sectional side view of the semiconductor device structure of FIG. 8 after fabricating a second device tier T2 on the first device tier T1, wherein the second device tier T2 comprises FinFET devices of a second dopant type (e.g. P-type FinFET devices), which is different from the first dopant type (e.g., N-type) of the FinFET devices of the first device tier T1. In particular, the second device tier T2 comprises a plurality of semiconductor fins 240-1 which are patterned from the semiconductor layer 240 (FIG. 8), gate structures 242 that are formed over portions of the vertical semiconductor fins 240-1, interlayer via contacts 250 which provide connections from source/drain regions of the FinFET devices of the second device tier T2 to the vertical device contacts 222 of the first device tier T1, vertical contacts 252 formed in contact with source/drain regions of the FinFET devices of the second device tier T2, and an insulating layer 260. In the exemplary embodiment of FIG. 9, the vertical semiconductor fins 240-1 extend in the Y-direction, and the interlayer via contacts 250 and vertical contacts 252 are formed in contact with exposed portions of the vertical semiconductor fins 240-1 which extend from sidewalls of the gate structures 242. The insulating layer 260 comprises a plurality of insulating layers (e.g., ILD layers) which are sequentially deposited at different stages of fabrication of the second device tier T2.

Following fabrication of the second device tier T2, a BEOL layer is formed to provide an interconnect network which provides wiring to connect active devices of the first and second device tiers, to form a power distribution plane for distributing power to the active devices of the first and second device tiers T1 and T2. Although not specifically shown in FIG. 9, vertical interconnect structures would be formed to extend through the first and second device tiers T1 and T2 down the backside power distribution plane 204. For example, in one embodiment wherein the first device tier T1 comprises N-type FinFET devices, and the second device tier T2 comprises P-type FinFET devices, and the backside power distribution plane 204 is utilized to distribute negative power supply voltage (e.g., ground or VSS) to the active circuitry, a plurality of vertical ground interconnect structures (e.g., vertical interconnect structure 134, FIG. 1) would formed to extend through the first and second device tiers down to the backside power distribution plane 204. In another embodiment, the backside power distribution plane 204 could be fabricated after completing processing of the upper device tiers T1 and T2, for example, by flipping and processing the backside of the wafer.

Figure 10:
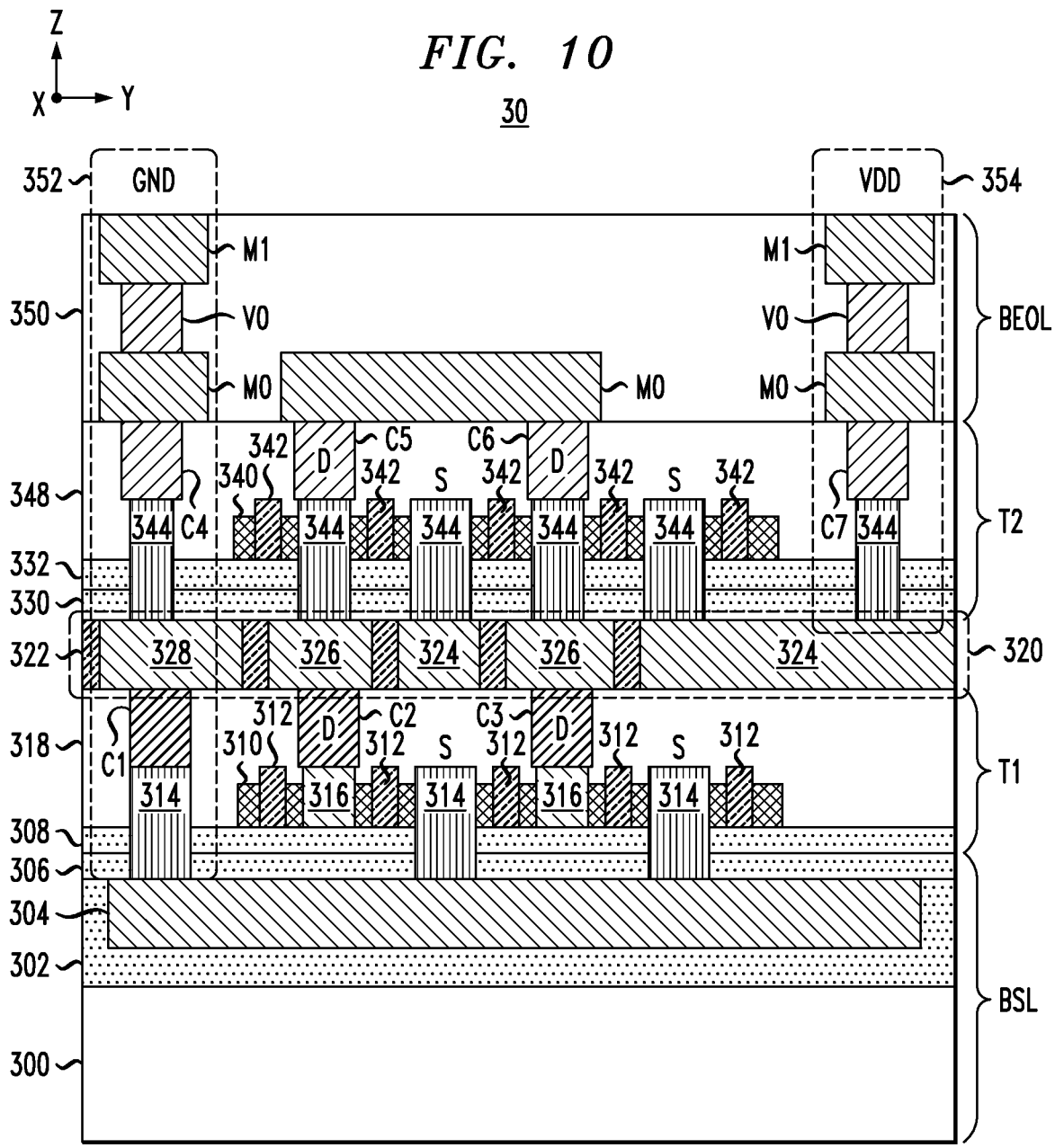
FIG. 10 is a schematic cross-sectional view of a monolithic 3D semiconductor integrated circuit device comprising a power distribution network having a backside power distribution plane and an inter-tier power distribution plane, according to an embodiment of the invention.

FIG. 10 is a schematic cross-sectional view of a monolithic 3D semiconductor integrated circuit device 30 comprising a power distribution network having a backside power distribution plane and inter-tier power distribution plane, according to an embodiment of the invention. As shown in FIG. 10, the semiconductor device 30 comprises a backside layer BSL, a first (lower) device tier T1, a second (upper) device tier T2, a back-end-of-line layer (or BEOL layer), and an inter-tier power distribution plane 320 disposed between the first and second device tiers T1 and T2. Similar to the embodiments discuss above, the backside layer BSL comprises a wafer substrate 300, an insulating layer 302 (e.g., oxide layer), a backside power distribution plane 304, and a bonding layer 306 (e.g., oxide bonding layer). The first device tier T1 comprises a bonding layer 308, a plurality of FinFET devices comprising a vertical semiconductor fin 310 which extends in a Y direction, and a plurality of gate structures 312 which extend in an X-direction and which overlap portions of the vertical semiconductor fin 310 to define channel regions of the FinFET devices. The portions of the vertical semiconductor fin 310 which extend from sidewalls of the gate structures 312 provide source/drain regions for the FinFET devices. The source/drain regions of the FinFET devices may comprise epitaxial semiconductor layers that are grown on the exposed surfaces of the vertical semiconductor fin 310 using known methods.

The first device tier T1 further comprises a plurality of interlayer via contacts 314, a plurality of source/drain contacts 316 (e.g., shared silicide trench contacts), vertical contacts C1, C2 and C3 (e.g., MOL contacts), and an insulating layer 318. As schematically shown in FIG. 10, the interlayer via contacts 314 provide vertical connections between the backside power distribution plane 302 and source/drain regions of the FinFET devices and vertical contacts (e.g., C1) of the first device tier T1. The MOL contacts C1, C2, and C3 (and horizontal interconnect wiring) may comprise metallic fill material including, but not limited to, tungsten, cobalt, ruthenium, copper, or combinations thereof, as well as thin liner layers which are formed prior to depositing the metallic fill material. In one embodiment, the source/drain contacts 316 may comprises a shared silicide trench contact, as is understood by one of ordinary skill in the art.

The inter-tier power distribution plane 320 comprises insulating material 322 (or insulating spacers) and metallization comprising a metallic plate 324 and isolated contact pads 326 and 328. In the exemplary embodiment of FIG. 10, the metallic plate 324 serves to distribute positive power supply voltage (e.g., VDD) or negative power supply voltage (e.g., ground or VSS) to the FinFET devices of the first and second device tiers T1 and T2. In addition, the contact pads 326 and 328 allow for signal connections and other power/ground connections to be routed through the inter-tier power distribution plane 320 between the device tiers T1 and T2 disposed above and below the inter-tier power distribution plane 320. As explained in further detail below, the insulating spacers 322 are disposed around the contact pads 326 and 328 to electrically isolate the contact pads 326 and 328 from the metallic plate 324.

The second device tier T2 comprises a plurality of FinFET devices comprising a vertical semiconductor fin 340 which extends in a Y-direction, and a plurality of gate structures 342 which extend in an X-direction and which overlap portions of the vertical semiconductor fin 340 to define channel regions of the FinFET devices. The portions of the vertical semiconductor fin 340 which extend from sidewalls of the gate structures 342 provide source/drain regions for the FinFET devices. The source/drain regions of the FinFET devices may comprise epitaxial semiconductor layers that are grown on the exposed surfaces of the vertical semiconductor fin 340 using known methods.

The second device tier T2 further comprises a plurality of interlayer via contacts 344, vertical contacts C4, C5, C6, and C7 (e.g., MOL contacts), and an insulating layer 348 (which comprises a plurality of insulating layers). As schematically shown in FIG. 10, the interlayer via contacts 344 provide vertical connections between the vertical contacts C4, C5, C6, and C7 and metallic structures of the inter-tier power distribution plane 320, as well as vertical connections between source/drain regions of FinFET devices of the second device tier T2 and the metallic structures of the inter-tier power distribution plane 320. The second device tier T2 is bonded to the inter-tier power distribution plane 320 by, e.g., oxide-to-oxide bonding of bonding layers 330 and 332, using methods as discussed herein.

The BEOL layer comprises an interconnect structure, which comprises multiple levels of metal lines and inter-level metal vias, to connect the integrated circuit components and devices (e.g., FinFET device) that are fabricated as part of the first and second device tiers T1 and T2, and to provide power distribution wiring for distributing/routing positive power supply voltage (e.g., VDD) and negative power supply voltage (e.g., ground or VSS) to the inter-layer power distribution plane 320 and the backside power distribution plane 304. The BEOL layer comprises a first level of metallization comprising a plurality of metallic structures M0 and vertical vias V0, and a second level of metallization comprising a plurality of metallic structures M1, which are encapsulated in insulating material 350 (e.g., multiple layers of dielectric material). As is understood by one of ordinary skill in the art, the metallic structures M0 and M1 may comprise horizontal wiring and contact pads to form part of the BEOL interconnect structures. The plurality of vertical vias V0 provide vertical connections between the wiring and contacts of the metallization levels M0 and M1 of the BEOL layer.

FIG. 10 schematically illustrates an exemplary embodiment of a FET-over-FET integration scheme of the monolithic 3D semiconductor IC device 30 in which the first device tier T1 comprises N-type FinFET devices and the second device tier T2 comprises P-type FinFET devices. In this exemplary embodiment, the backside power distribution plane 304 comprises a backside negative power supply voltage distribution plane (e.g., GND plane or VSS plane) disposed below the stack of device tiers T1 and T2, and the inter-tier power distribution plane 320 comprises a positive power supply voltage distribution plane (e.g., VDD plane).

As schematically illustrated in FIG. 10, some of the N-type FinFET devices of the first device tier T1 have source regions which are connected to the backside power distribution plane 304 through the interlayer via contacts 314 to provide ground (or VSS) connections to the source regions. In addition, some of the N-type FinFET devices of the first device tier T1 have drain regions which are connected to the metallic plate 324 of the inter-tier power distribution plane 320 to provide positive power supply voltage (e.g., VDD) connections to the drain regions. Further, some of the P-type FinFET devices of the second device tier T2 have source regions which are connected to the metallic plate 324 of the inter-tier power distribution plane 320 to provide positive power supply voltage (e.g., VDD) connections to the source regions. In addition, as schematically illustrated in FIG. 10, some N-type and P-type FET devices of the first and second device tiers T1 and T2 have drain regions which are connected through vertical connections formed by the vertical contacts C2, C3 of the first device tier T1, isolated contact pads 326 of the inter-tier power distribution plane 320, and interlayer via contacts 344 of the second device tier T2.

As further schematically illustrated in FIG. 10, a vertical interconnect structure 352 is formed to route a ground (GND) connection from the metallization level M1 to the backside power distribution plane 304. The vertical interconnect structure 352 is formed, in part, by interlayer via contacts 314 and 344 of the device tiers T1 and T2, and an isolated contact pad 328 of the inter-tier power distribution plane 320. While only one vertical interconnect structure 352 for ground is shown for ease of illustration, the semiconductor device 30 would comprise a plurality of similar vertical interconnect structures 352 periodically distributed over the given device layout to provide multiple ground connections to the backside power distribution plane 304 from the upper BEOL layer.

While the vertical interconnect structure 352 is schematically shown in FIG. 10 to include a series of vertical contacts, in other embodiments, the vertical interconnect structure 352 can include horizontal lines at one or more metallization levels for laterally routing the vertical interconnect structure 352 as necessary for the given layout. In addition, the vertical interconnect structure could also include unique via levels (e.g., tall via bars, etc.) to skip metal levels and provide reduced resistance, etc. The same applies to other vertical interconnect structures (e.g., the interconnect structure 134, FIG. 1).

Further, a vertical interconnect structure 354 is formed to route a positive power supply voltage (e.g., VDD) connection from the metallization level M1 to the metallic plate 324 of the inter-tier power distribution plane 320. The vertical interconnect structure 354 is formed, in part, by an interlayer via 344 of the second device tier T2, which is formed in contact with the metallic plate 324 of the inter-tier power distribution plane 320. While only one vertical interconnect structure 354 for the positive power supply voltage (e.g., VDD) connection is shown for ease of illustration, the semiconductor device 30 would comprise a plurality of similar vertical interconnect structures 354 periodically distributed over the device layout to provide multiple VDD connections to the metallic plate 324 of the inter-tier power distribution plane 320 from the upper BEOL layer.

In an alternate embodiment, a FET-over-FET integration scheme of the monolithic 3D semiconductor IC device 30 can be implemented in which the first device tier T1 comprises P-type FinFET devices and the second device tier T2 comprises N-type FinFET devices. In such alternate embodiment, the backside power distribution plane 304 would be utilized to distribute positive power supply voltage (VDD) to the device tiers T1 and T2 (e.g., source regions of the P-type FinFET devices of the first device tier T1 would be connected to the backside power distribution plane 304 by the interlayer via contacts 314). In addition, the inter-tier power distribution plane 320 would be utilized to distribute negative power supply voltage (ground or VSS) to the device tiers T1 and T2, and provide isolated contact pads to allow vertical VDD interconnects to be routed from the BEOL layer through the inter-tier power distribution plane 320 down to backside power distribution plane 304.

Figure 11A:
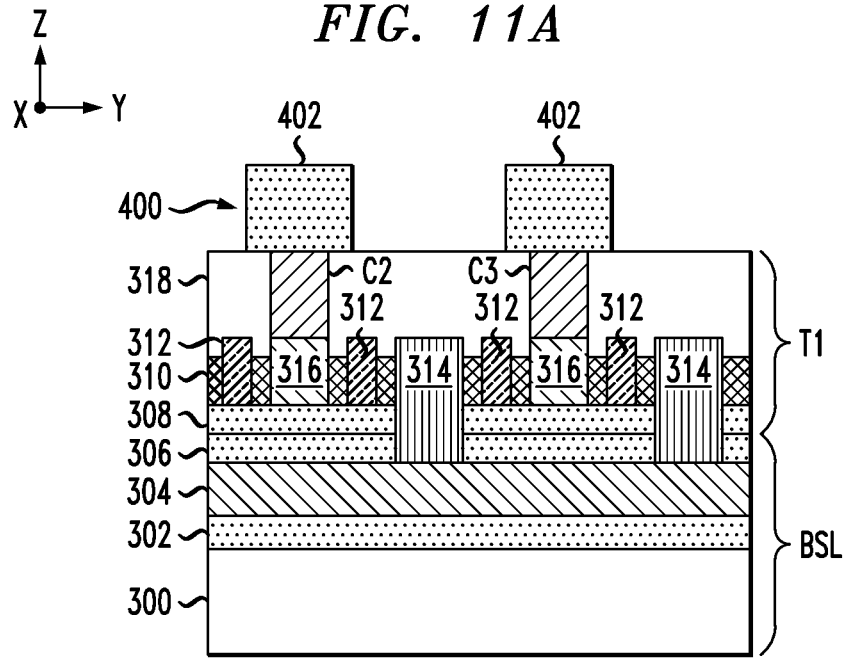
Figure 11B:
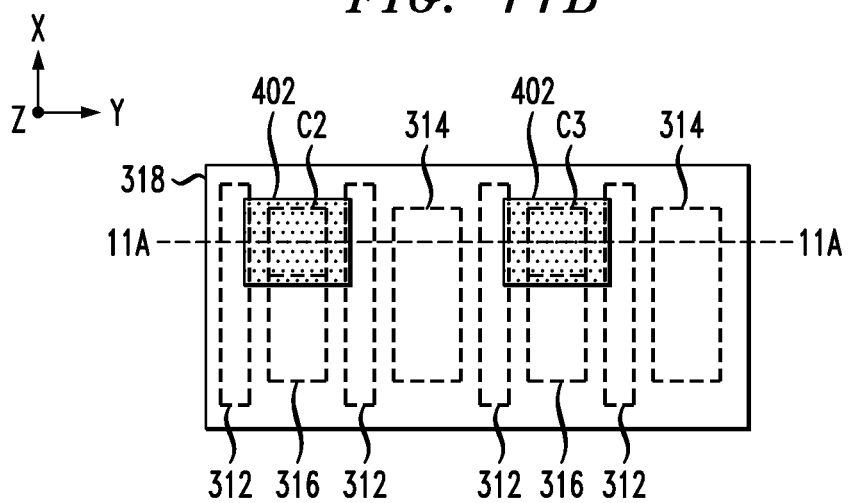
FIG. 11B is a top plan view of the intermediate semiconductor device structure shown in FIG. 11A.

Various fabrication methods can be utilized to form an inter-layer power distribution plane, such as shown in FIG. 10. For example, FIGS. 11A through 16B schematically illustrate a method for fabricating the monolithic 3D semiconductor integrated circuit device 30 of FIG. 10 with the inter-tier power distribution plane 320, according to an embodiment of the invention. To begin, FIGS. 11A and 11B schematically illustrate an intermediate stage of fabrication in which a pattern 400 of sacrificial mandrels 402 is formed on the first device tier T1. FIG. 11A is a schematic cross-sectional side view (Y-Z plane) of the semiconductor device structure along line 11A-11A in FIG. 11B, and FIG. 11B is a top plan view (Y-Y) plane of the semiconductor device structure of FIG. 11A.

In one embodiment, sacrificial mandrels 402 define images of isolated contact pads (e.g., 324 and 326 of FIG. 10) that are to be formed as part of the inter-tier power distribution plane 320. As shown in FIGS. 11A and 11B, the sacrificial mandrels are disposed over, and aligned to, the vertical contacts C2 and C3. In FIG. 11B, the footprints of the gate structures 312, interlayer via contacts 314, source/drain contacts 316, and vertical contacts C2 and C3 are shown in phantom (dashed lines) to illustrate an exemplary layout pattern.

In one embodiment, the pattern 400 of sacrificial mandrels 402 are formed by depositing and patterning a layer of sacrificial material on the upper surface of the first device tier T1. In one embodiment, the sacrificial material comprises amorphous silicon (a-Si). In other embodiments, multiple layers of materials may be formed in addition to the a-Si layer, depending on the patterning method that is used to form the mandrel pattern 400. For example, a thin layer of anti-reflection coating (ARC) material and a thin nitride layer may be deposited prior to depositing the a-Si layer.

Figure 12:
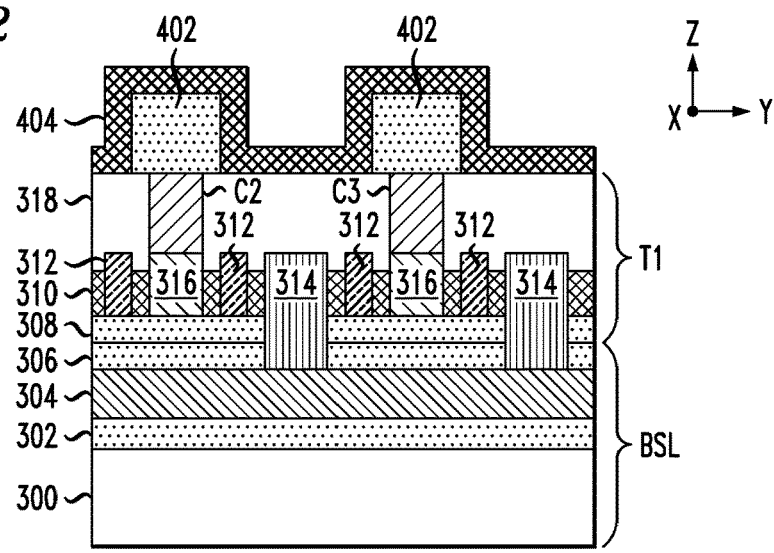

Next, FIG. 12 is a schematic cross-sectional side view of the semiconductor device structure of FIG. 11A after forming a conformal layer of insulating material 404 over the surface of the semiconductor device structure to cover the sacrificial mandrels 402. In one embodiment the conformal insulating layer 404 comprises a silicon oxide material, or any other suitable insulating material which can be etched selective to the materials that form the sacrificial mandrels 402 and the insulating layer 318 of the first device tier, and which comprises a relatively low dielectric constant to minimize parasitic capacitance.

Figure 13A:
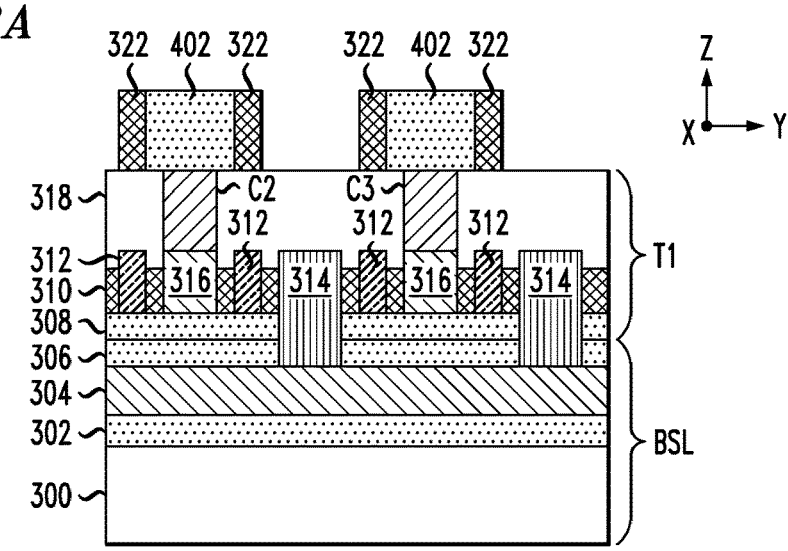
FIG. 13A is a schematic cross-sectional side view of the semiconductor device structure of FIG. 12 after patterning the conformal insulating layer to form insulating spacers on vertical sidewalls of the sacrificial mandrels.
Figure 13B:
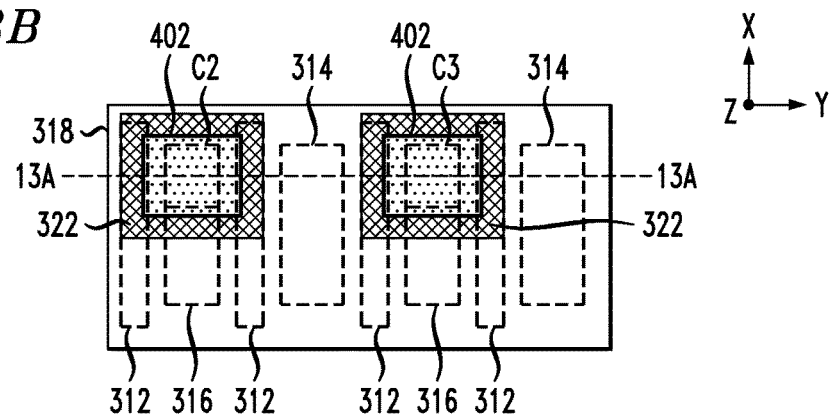
FIG. 13B is a top plan view of the semiconductor device structure of FIG. 13A.

Next, FIGS. 13A and 13B are schematic views of the semiconductor device structure of FIG. 12 after patterning the conformal insulating layer 404 to form insulating spacers on the vertical sidewalls of the sacrificial mandrels 402. FIG. 13A is a schematic cross-sectional side view (Y-Z plane) of the semiconductor device structure along line 13A-13A in FIG. 13B, and FIG. 13B is a top plan view (Y-Y) plane of the semiconductor device structure of FIG. 13A. In one embodiment, the conformal insulating layer 404 is patterned using a directional dry etch process (e.g., Reactive Ion Etch (RIE)) with an etch chemistry that is configured to anisotropically etch away lateral portions of the conformal insulating layer 404 selective to the sacrificial mandrels 402 and the insulating layer 318. As illustrated in FIG. 13B, the directional etch process results in the formation of the insulating spacers 322 which surround the sacrificial mandrels 402.

Figure 14:
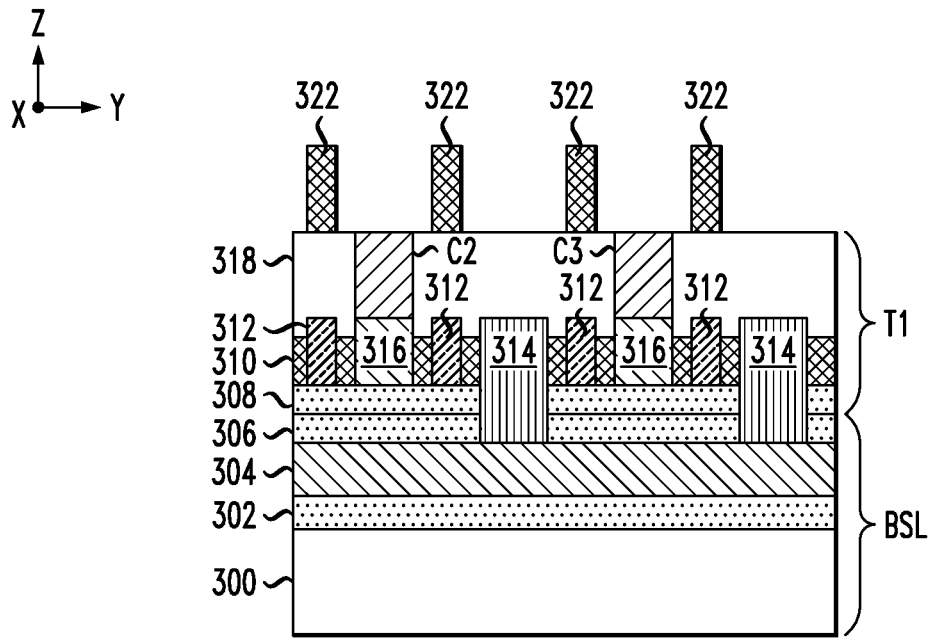

A next stage of the fabrication process comprises removing the sacrificial mandrels 402 and depositing metallic material to form the isolated contact pads and metallic plate of the inter-tier power distribution plane 320. For example, FIG. 14 is a schematic cross-sectional side view of the semiconductor device structure of FIG. 13A after removing the sacrificial mandrels 402. In one embodiment, the sacrificial mandrels 402 are removed using a dry etch process or wet etch process having an etch chemistry which is configured to etch away the material of the sacrificial mandrels 420 highly selective to the materials of the insulating spacers 322 and the insulating layer 318 of the first device tier T1.

Figure 15:
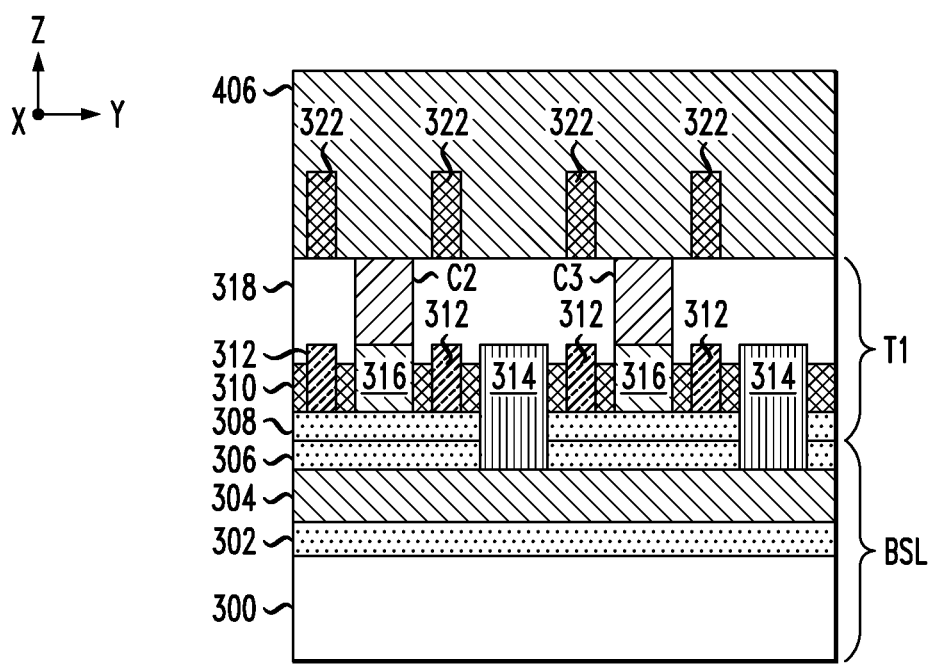

Next, FIG. 15 is a schematic cross-sectional side view of the semiconductor device structure of FIG. 14 after depositing a layer of metallic material 406 to encapsulate the insulating spacers 322 in metallic material. In one embodiment, the layer of metallic material 406 comprises tungsten. In another embodiment, the layer of metallic material comprises cobalt. In another embodiment, a thin liner layer (e.g., diffusion barrier and/or seed layer) is conformally deposited prior to depositing the layer of metallic material 406.

Figure 16A:
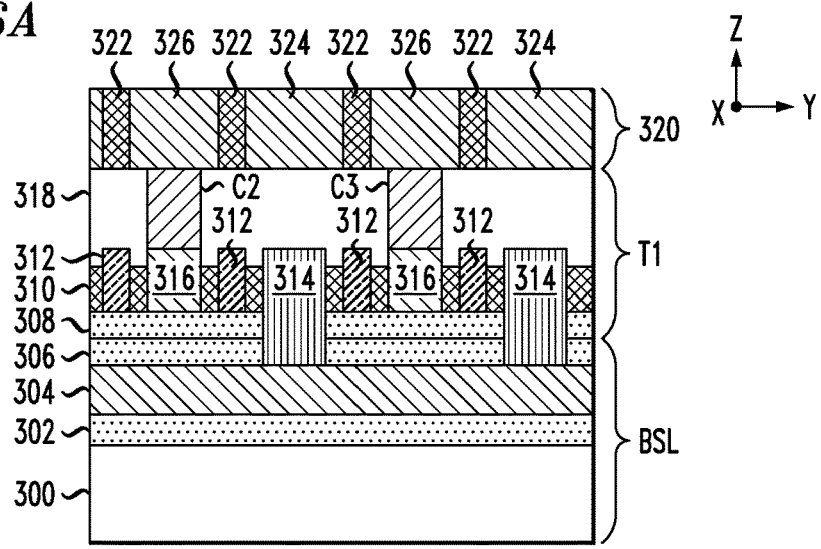
FIG. 16A is a schematic cross-sectional side view of the semiconductor device structure of FIG. 15 after planarizing the surface of the semiconductor device structure down to upper surfaces of the insulating spacers to remove overburden metallic material and form the inter-tier power distribution plane.
Figure 16B:
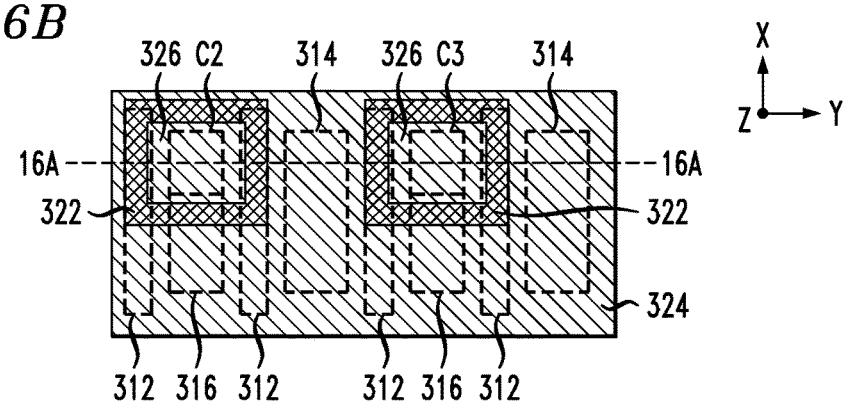

FIGS. 16A and 16B are schematic views of the semiconductor device structure of FIG. 15 after planarizing the surface of the semiconductor device structure down to upper surfaces of the insulating spacers 322 to remove the overburden metallic material and form the inter-tier power distribution plane 320. FIG. 16A is a schematic cross-sectional side view (Y-Z plane) of the semiconductor device structure along line 16A-16A in FIG. 16B, and FIG. 16B is a top plan view (Y-Y) plane of the semiconductor device structure of FIG. 16A. In one embodiment, a chemical mechanical polishing (CMP) process is performed to remove the overburden metallic material and planarize the surface of the semiconductor device structure, resulting in the formation of the inter-tier power distribution plane 320.

As shown in FIGS. 16A and 16B, the resulting structure of the inter-tier power distribution plane 320 comprises a plurality of contact pads 326 which are surrounded by the insulating spacers 322, with a continuous metallic plate structure 324 surrounding the isolated contact pads 326. Following formation of the inter-tier power distribution plane 320, the fabrication process continues with depositing the oxide bonding layer 330 (FIG. 10) on the upper surface of the inter-tier power distribution plane 320, performing a wafer bonding process, such as discussed above and illustrated in FIG. 8, to bond a silicon wafer to the first device tier T1, fabricating the second device tier T2 using the silicon wafer, and fabricating a BEOL layer above the second device tier T2, resulting in the structure shown, for example, in FIG. 10.

The inter-tier power distribution plane 320 can be fabricated using other techniques. For example, in one embodiment, the inter-tier power distribution plane 320 can be fabricated by depositing a layer of metallic material, and then patterning the metallic material to form trenches that define insulating rings which surround isolated portions (contact pads) of the metallic layer. A layer of insulating material is then deposited to fill the trenches with the insulating material to form the insulating spacers 322 that surround the isolated portions (contact pads) of the metallic layer, followed by a CMP process to remove the overburden insulating material and planarize the surface of the semiconductor device structure. In another embodiment, the inter-tier power distribution plane 320 can be fabricated by depositing a layer of insulating material, and then patterning the layer of insulating material to form the insulating spacers 322. This process would eliminate the need to form the sacrificial mandrels as discussed above. A layer of metallic material is then deposited to encapsulate the insulating spacers 322, followed by a CMP process to remove the overburden metallic material.

Figure 17:
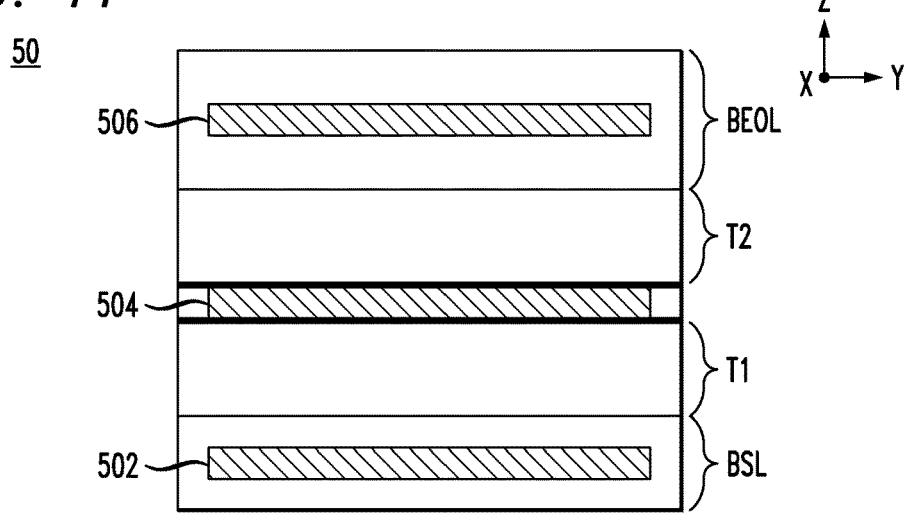
FIG. 17 is a schematic cross-sectional view of a monolithic 3D semiconductor integrated circuit device comprising a power distribution network having a backside power distribution plane, an inter-tier power distribution plane, and a back-end-of-line power distribution plane, according to an embodiment of the invention.

In other embodiments, a monolithic 3D semiconductor integrated circuit device can be fabricated with a power distribution network which utilizes three or more power distribution planes. For example, FIG. 17 is a schematic cross-sectional view of a monolithic 3D semiconductor integrated circuit device 50 comprising a power distribution network having a backside power distribution plane 502, an inter-tier power distribution plane 504, and a BEOL power distribution plane 506, according to an embodiment of the invention. In particular, as generically illustrated in FIG. 17, the backside power distribution plane 502 is formed within a backside layer BSL below first and second device tiers T1 and T2, the inter-tier power distribution plane 504 is formed between the first and second device tiers T1 and T2, and the BEOL power distribution plane 506 is formed as part of a BEOL layer above the first and second device tiers.

While the power distribution planes 502, 504 and 506 are generically illustrated in FIG. 17, the power distribution planes 502, 504 and 506 can be fabricated to have various configurations and layouts which are similar to the exemplary embodiments discussed herein, including single metallization layer or multiple (stacked) metallization layers. In addition, depending on the type of FET devices (N or P type) in the device tiers T1 and T2 and the given layout, at least two of the three the power distribution planes can be utilized as positive power supply voltage distribution layers, while one power distribution planes is utilized as a negative power supply voltage distribution layer.

For example, if the first device tier T1 comprises N-type FET devices and the second device tier comprises P-type FET devices, the BEOL and inter-tier power distribution planes 506 and 504 can be used as VDD distribution planes, while the backside power distribution plane 502 can be utilized as a ground or VSS distribution plane. In another exemplary embodiment, if the first device tier T1 comprises P-type FET devices and the second device tier comprises N-type FET devices, the BEOL and backside power distribution planes 506 and 502 can be used as VDD distribution planes, while the inter-tier power distribution plane 504 is utilized as a ground or VSS distribution plane. In another embodiment, if the first and second device tiers T1 and T2 comprise both P-type and N-type FET devices (e.g. CMOS-over-CMOS integration), then one or more or all of the backside, inter-tier, and BEOL power distribution planes 502, 504, and 506 can be configured to distribute both positive and negative power supply voltage. It is to be appreciated that other configurations are possible, and nothing herein shall be construed as a limitation on the number and/or types of power distribution planes that are utilized to form power distribution networks for monolithic 3D semiconductor integrated circuit devices.

It is to be understood that the methods discussed herein can be incorporated within semiconductor processing flows for fabricating other types of semiconductor devices and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

We claim:

1. A device comprising:
   a backside layer comprising a first power distribution plane;
   a first device tier disposed over the backside layer, wherein the first device tier comprises an integrated circuit comprising field-effect transistor devices;
   at least one interlayer via which vertically connects a source/drain region of at least one field-effect transistor device of the first device tier to the first power distribution plane;
   a second device tier disposed over the first device tier, wherein the second device tier comprises an integrated circuit comprising field-effect transistor devices;
   a back-end-of-line layer disposed over the second device tier, and
   an interconnect structure which extends from the back-end-of-line layer through the second device tier and the first device tier and which contacts the first power distribution plane to connect at least one of positive power supply voltage and negative power supply voltage to the first power distribution plane;
   wherein the back-end-of-line layer comprises a second power distribution plane to distribute at least one of positive power supply voltage and negative power supply voltage to the field-effect transistor devices of the second device tier.

2. The device of claim 1, wherein the first power distribution plane comprises at least one metallic plate, wherein the at least one interlayer via provides a direct vertical connection from the source/drain region of the at least one field-effect transistor device of the first device tier to the at least one metallic plate of the first power distribution plane.

3. The device of claim 1, wherein the first power distribution plane comprises a plurality of parallel wires, wherein the at least one interlayer via provides a direct vertical connection from the source/drain region of the at least one field-effect transistor device of the first device tier to at least one of the plurality of parallel wires.

4. The device of claim 1, wherein the first power distribution plane is configured to distribute negative power supply voltage to the field-effect transistor devices of the first device tier, and wherein the second power distribution plane is configured to distribute positive power supply voltage to the field-effect transistor devices of the second device tier.

5. The device of claim 1, wherein the first power distribution plane is configured to distribute positive power supply voltage to the field-effect transistor devices of the first device tier, and wherein the second power distribution plane is configured to distribute negative power supply voltage to the field-effect transistor devices of the second device tier.

6. The device of claim 1, wherein the second power distribution plane comprises a metallic plate and a plurality of contact pads which are isolated from the metallic plate by insulating spacers surrounding the contact pads.

7. The device of claim 6, wherein the vertical interconnect structure which extends from the back-end-of-line layer through the first and second device tiers, and in contact with the first power distribution plane, is formed, in part, by at least one of the contact pads of the second power distribution plane.

8. The device of claim 1, wherein the second power distribution plane comprises a plurality of parallel wires.

9. The device of claim 1, further comprising an inter-tier power distribution plane disposed between the first and second device tiers.

10. The device of claim 1, wherein the inter-tier power distribution plane comprises a metallic plate and a plurality of contact pads which are isolated from the metallic plate by insulating spacers surrounding the contact pads.

* * * * *